United States Patent
Gaun et al.

(10) Patent No.: US 7,122,853 B1
(45) Date of Patent: Oct. 17, 2006

(54) METHOD TO IMPROVE YIELD AND SIMPLIFY OPERATION OF POLYMER MEMORY CELLS

(75) Inventors: David Gaun, Brookline, MA (US); Stuart Spitzer, Lynnfield, MA (US); Nicolay F Yudanov, Brookline, MA (US)

(73) Assignee: FASL, Inc., Sunnyvale, CA (US)

( * ) Notice: Subject to any disclaimer, the term of this patent is extended or adjusted under 35 U.S.C. 154(b) by 0 days.

(21) Appl. No.: 10/919,872

(22) Filed: Aug. 17, 2004

(51) Int. Cl.
*H01L 35/24* (2006.01)
*H01L 51/00* (2006.01)

(52) U.S. Cl. .............. 257/295; 257/40; 257/E27.078; 257/E29.3; 438/3; 438/82; 438/99

(58) Field of Classification Search .......... 257/295, 257/40, E27.078, E29.3; 438/82, 99, 3
See application file for complete search history.

(56) References Cited

U.S. PATENT DOCUMENTS 6,982,188 B1 * 1/2006 Xie et al. .................. 438/99

2003/0082444 A1 * 5/2003 Kuhr et al. ................ 429/149

\* cited by examiner

*Primary Examiner*—Kenneth Parker
*Assistant Examiner*—Joseph Nguyen
(74) *Attorney, Agent, or Firm*—Amin & Turocy, LLP

(57) ABSTRACT

Systems and methodologies are provided for simplifying a polymer memory cell's operation by employing a post polymer growth treatment to form ionic or super ionic metal compounds therein. Such post polymer growth treatment facilitates distribution and mobility of metal ions (or charged metallic molecules) within an active layer of the polymer memory cell, and mitigates (or eliminates) a need for initialization procedures. Moreover, the post treatment of the present invention can also facilitate controlling a distribution of various thresholds (e.g., write and erase threshold), and set them to predetermined values Accordingly, variability in threshold values of polymer memory cells that can result from initialization processes can be mitigated (or eliminated), and thicker polymer layers can be employed without an initialization penalty.

10 Claims, 10 Drawing Sheets

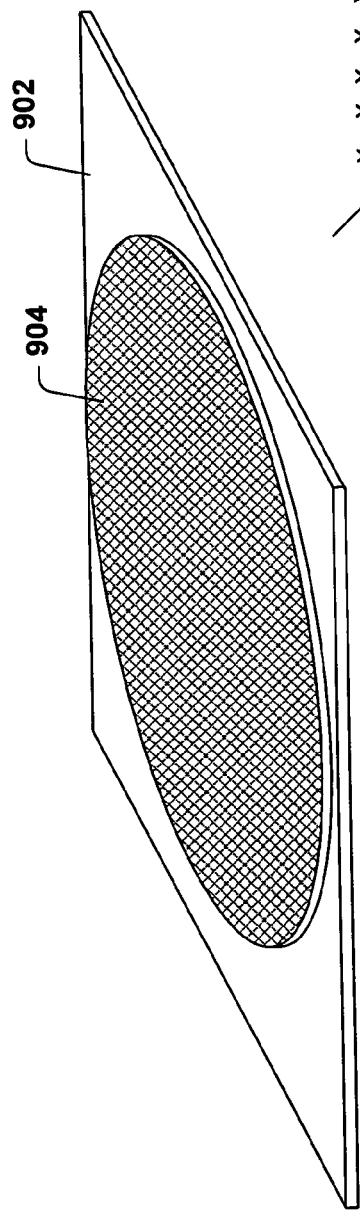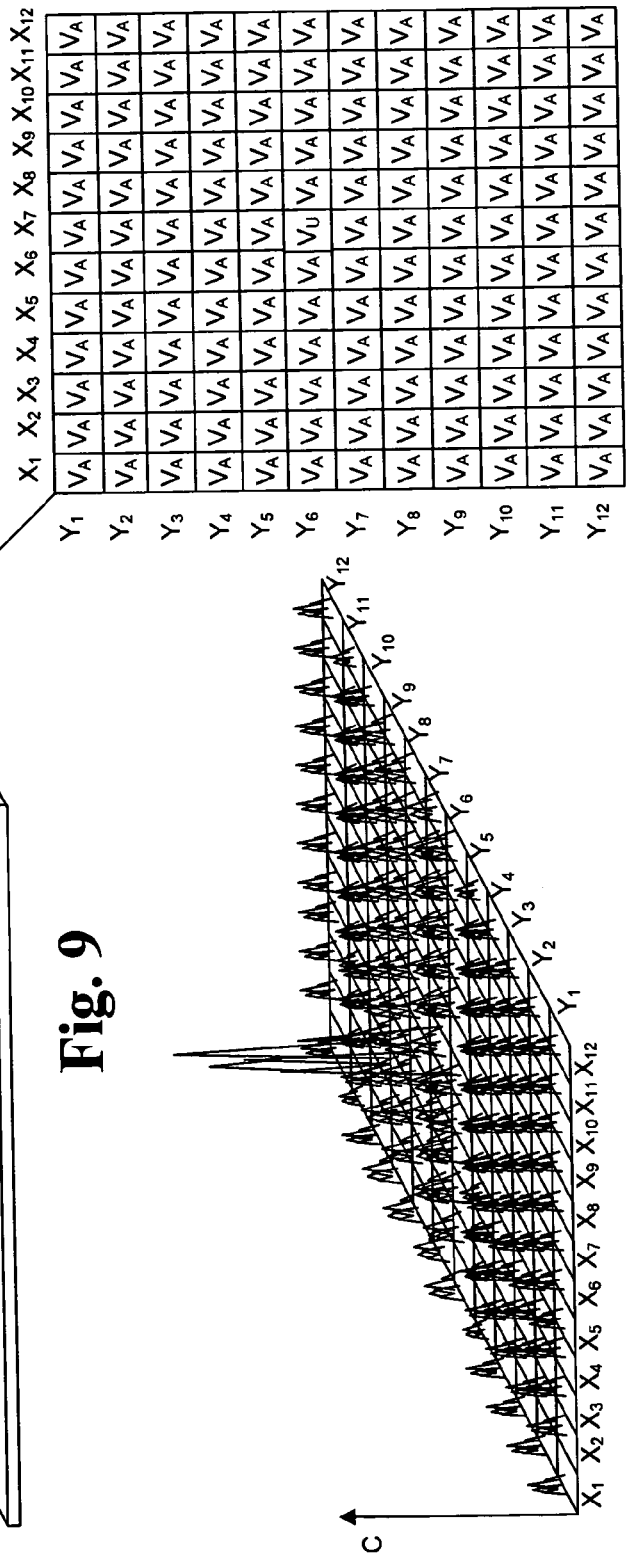
Fig. 9
Fig. 10
Fig. 11

METHOD TO IMPROVE YIELD AND SIMPLIFY OPERATION OF POLYMER MEMORY CELLS

TECHNICAL FIELD

The present invention relates generally to improving yield and functionality of memory cells, and in particular to post treatment and exposure of polymer memory cell layers to compounds that can react with metal particles therein to create metal ions (or charged metallic molecules), thus mitigating a need for an initialization of the polymer memory cell.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells can typically maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like). Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. In addition, employment of organic materials typically can require cumbersome initialization procedures that can adversely affect performance of such devices. Therefore, there is a need to overcome the aforementioned deficiencies associated with conventional systems

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The present invention provides for systems and methods of simplifying a polymer memory cell's operation by employing a post polymer growth treatment to form ionic or super ionic metal compounds therein. Such post polymer growth treatment facilitates the distribution and mobility of metal ions (or charged metallic molecules) within an active layer of the polymer memory cell, and mitigates (or eliminates) a need for initialization procedures. Typically, initialization procedures can affect threshold values, and subsequent programming of a polymer memory cells. The thresholds can for example designate a lower limit associated with a particular programming state for the polymer memory cell. Moreover, the present invention can facilitate controlling a distribution of various thresholds (e.g., write and erase threshold), and set them to predetermined values. Accordingly, variability in threshold values of polymer memory cells that typically results from initialization processes can be mitigated or eliminated.

The post treatment methodology of the present invention can employ ammonium sulfate $(NH_4)_2S$, ammonium selenide $(NH_4)_2Se$, hydrogen sulfide $(H_2S)$, hydrogen selenide $(H_2Se)$, hydrogen telluride $(H_2Te)$ and the like, as compounds to react with the active layer's metal particles (or metal containing molecular groups MCMG), to create the metal ions (and/or charged chalcocides or other metallic molecules) therein. The polymer memory cell to be programmed can include various active, and/or passive (superionic) and/or barrier layers, as described in more detail infra.

According to one aspect of the present invention a passive (or superionic) layer(s) (e.g. $Cu_2S$) can be initially formed over a conductive substrate (e.g. copper layer). Over such passive layer, an active polymer layer can be subsequently grown, for example via a CVD process. During such growth a quantity of material from the conductive substrate can become incorporated into the active layer, for example in the form of metal ions or molecular groups (e.g. 2–12% copper concentrations) being trapped or chemically active in the active layer. Next, the active/passive layering arrangement, which can form layering for an organic memory cell, is brought in to contact with post treatment compounds, e.g. $(NH_4)_2S$, $(NH_4)_2Se$, $H_2S$, $H_2Se$, and $H_2Te$. Such post treatment of the active layer increases a mobility and availability of the metal ions incorporated therein, and mitigates a need for initialization procedures; e.g. by subjecting the active/passive layers to an initial electric field to provide a supply of positive ions within the polymer active layer. As such, performance variations in a polymer memory cell that can result from the initialization process can be reduced, allowing thicker polymer films to be efficiently employed as part of the active layer. Typically, such can also increase the polymer memory cell yield.

In a related aspect of the present invention, the polymer memory cell treated with the post treatment compounds can be programmed by being subjected to an external stimulus. Such an external stimulus can be supplied via a control component, and can influence an electrical or optical property associated with the polymer memory cell. The control component can further control the external stimulus, and thereby regulate and/or trace the influenced property of the organic memory cell. Such programming can typically provide for stability, viability and fast switching of a memory cell's operation at a single or multi-bit level.

According to yet another aspect of the present invention, exposure of active and passive layers to the post treatment compounds (e.g., $(NH_4)_2S$, $(NH_4)_2Se$, $H_2S$, $H_2Se$, and $H_2Te$) can be regulated via a controlled process depending on various factors, such as for example: thickness of the active polymer layer, composition of the polymer layer, concentration of positive ions in the polymer, and the like. Such exposure can also densify the polymer, and reduce void formation in underlying copper metallization, when copper plugs are employed as part of the polymer memory cell.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

BRIEF DESCRIPTION OF THE DRAWINGS

FIG. 9 and FIG. 10 illustrate a wafer having a polymer layer and a partitioned grid pattern for a post treatment procedure according to the present invention.

FIG. 11 illustrates a table of signature values for a post treatment procedure according to one aspect of the present invention.

DETAILED DESCRIPTION OF THE INVENTION

Figure 1:
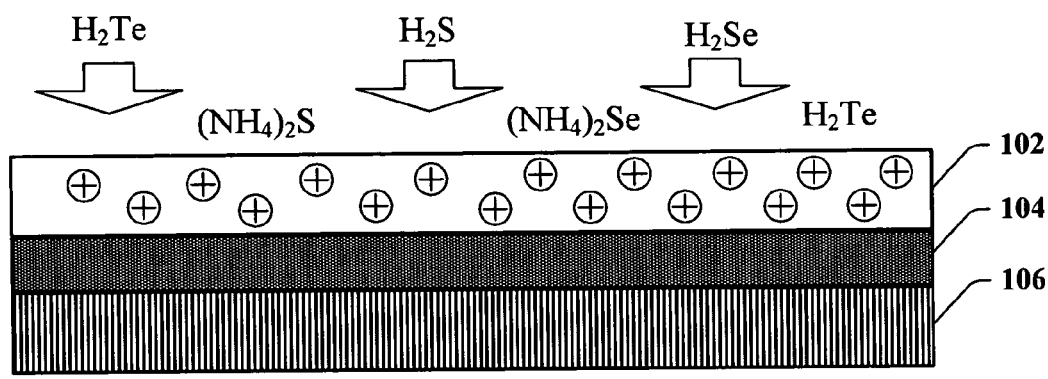
FIG. 1 illustrates a schematic diagram for an exposure of polymer memory cell layers to post treatment compounds in the gaseous state according to exemplary aspects of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The present invention provides for a post polymer growth treatment with compounds that can react with the active layer's metallic clusters to create metal ions (or charged metallic molecules) therein. Such compounds can for example include: ammonium sulfate $(NH_4)_2S$, ammonium selenide $(NH_4)_2Se$, hydrogen sulfide $(H_2S)$, hydrogen selenide $(H_2Se)$, hydrogen telluride $(H_2Te)$ and the like. The post treatment methodology of the present invention can mitigate a need for initialization procedures that can typically be required to affect reference threshold values, and subsequent programming of a polymer memory cell. The initialization procedures typically can introduce variations in threshold references, and reduce yield or increase costs when designing polymer memory cell devices.

Referring initially to FIG. 1, a schematic diagram for an exposure of polymer memory cell layers to post treatment compounds according to one aspect of the present invention is illustrated. Such post treatment compound can be any compound that can react with the active layer's metal particles ($M^0$) to create metal ions, or charged chalcocides or other metallic molecules ($M^+$) therein; e.g. $(NH_4)_2S$, $(NH_4)_2Se$, $H_2S$, $H_2Se$, $H_2Te$ and the like. For example, in one particular aspect of the present invention, the following chemical reaction can take place during the treatment process:

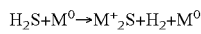

It is to be appreciated that any of the post treatment compounds described above can be individually employed, even though FIG. 1 illustrates presence of many of such compounds acting on polymer memory cell layers. Such polymer memory cell layers can include an active layer 102 and a passive (superionic) layer 104 that are deposited over a conducting layer 106. The active layer 102 can change an impedance state (e.g., from a high resistance to a low resistance) when subject to a stimulus such as a voltage or current. An active molecule or molecular group forming the active layer can be one that changes a property when subjected to an electrical field and/or light radiation, (e.g., ionizable group); such as: nitro group, amino group, cyclopentadienyl, dithiolane, methlcyclopentadienyl, fulvalenediyl, indenyl, fluorenyl, cyclobis(paraquart-p-phenylene), bipyridinium, phenothiazine, diazapyrenium, benzonitrile, benzonate, benzamide, carbazole, dibenzothiophene, nitrobenzene, aminobenzenesulfonate, aminobenzoate, and molecular units with redox-active metals; metallocenes (Fe, V, Cr, Co, Ni and the like) complex, polypyridine metal complex (Ru, Os and the like).

In another aspect of the present invention, the active layer 102 can include polymers such as polyaniline, polythiophene, polypyrrole, polysilane, polystyrene, polyfuran, polyindole, polyazulene, polyphenylene, polypyridine, polybipyridine, polyphthalocyanine, polysexithiophene, poly(siliconoxohemiporphyrazine), poly(germaniumoxohemiporphyrazine), poly(ethylenedioxythiophene), polyfluorene, polyphenylacetylene, polydiphenylacetylene and related derivatives with active molecular group. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraazatetramethylannulene and so on); porphyrin, phthalocyanine, hexadecafluoro phthalocyanine and their derivatives with active molecular group.

In a related aspect of the present invention, the active layer can comprise; polymer polyphenylacetylene+molecules of chloranil or tetracyano-quino-dimethane or dichlordicyanoquinone, copper phthalocyanine (which can be deposited by thermal deposition method to about 30 Å–1000 Å); copper hexadecafluoro phthalocyanine, amorphous carbon or palladium, (which can be deposited on the upper surface of the active layer by magnetron co-sputtering); and polysilanes with N-carbazolylpropyl group; polymer polythiophene with cyclopentadienyl groups; polysilanes with cyclopentadienyl groups; polysilanes with amino groups; polythiophene with alkyl amino groups; polythiophene with cyclopentadienyl alkyl groups; composite containing polydiphenylacetylene containing carbazolyl groups and dinitro-n-phenyl (DNP); polyethylenedioxythiophene and porous ferroelectric (polyvinyline fluoride) containing $LiCF_3SO_3$ salt, polyethylenedioxythiophene and salt of potassium hexycyanoferrate.

As depicted in FIG. 1, the active layer 102 can be formed over the passive layer 104 on top of a conductive layer 106, to fabricate layers of a polymer memory cell. The active layer 102 can be fabricated via a number of suitable techniques. One such technique involves growing the active layer 102 in the form of an organic layer from the passive layer 104. During such growth a quantity of material from conductive substrate can become incorporated into the active layer, for example in the form of metal ions (e.g., 2–12% copper concentrations) being chemically bound or trapped in the active layer 102. Likewise, chemical vapor deposition (CVD) techniques can also be employed. Typically, CVD can include low pressure chemical vapor deposition (LPCVD), atmospheric pressure CVD (APCVD), plasma enhanced chemical vapor deposition (PECVD), and high density chemical vapor deposition (HDCVD).

In a related aspect of the present invention, the active layer 102 can also be comprised of a conjugated organic material, such as a small organic molecule and a conjugated polymer. If the organic layer is polymer, a polymer backbone of the conjugated organic polymer may extend lengthwise between conducting layer 106 and a top conducting electrode (not shown) placed on the active layer after a treatment thereof with post treatment compound (e.g., generally substantially perpendicular to the inner, facing surfaces of the conducting layer 106). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials facilitates control of properties associated with the memory cell fabricated from such layers. In this connection, the conjugated organic material of the active layer 102 has the ability to donate and accept charges (holes and/or electrons), and trap ions. Generally, the conjugated organic molecule has at least two relatively stable oxidation-reduction states. The two relatively stable states permit the conjugated organic polymer to donate and accept charges, when interacting with the passive (superionic) layer. Moreover when employing CVD techniques, it is not generally necessary to functionalize one or more ends of the organic molecule in order to attach it to the passive layer 104. Sometimes such organic molecules can have a chemical bond formed between the conjugated organic polymer of the active layer 102 and the passive layer 104.

In one particular aspect of the present invention, the organic material employed as part of the active layer can be cyclic or acyclic. For some cases, such as organic polymers, the organic material can self assemble during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

Such organic material, which in one exemplary aspect can form the active layer 102, has a suitable thickness that depends upon the chosen implementations of the memory cell being fabricated. Some suitable exemplary ranges of thickness for the organic polymer layer, which in part can form the active layer 102, are about 10 nm or more and about 200 nm or less. Similarly, the passive layer 104 can have a suitable thickness that can vary based on the implementation of the memory cell being fabricated. Some examples of suitable thicknesses for the passive layer 104 can be: a thickness of about 5 nm or more and about 200 nm or less.

According to one aspect of the present invention, the passive layer can be selectively grown, spun-on, deposited upon the conducting layer 106 via CVD, vacuum thermal evaporation, sputtering, or plasma enhanced chemical vapor deposition (PECVD) utilizing a metal organic (MO) precursor. The deposition process can be monitored and controlled to facilitate, among other things, depositing the conductivity facilitating compound to a desired thickness.

Additionally, the passive layer 104 facilitates metal ion injection into the active layer 102 and increases the concentration of metal ions in the active layer 102 that can modify the conductivity of the active layer 102.

The passive layer 104 contains at least one conductivity facilitating compound that has the ability to donate and accept ions. Generally, the conductivity facilitating compound has at least two relatively stable oxidation-reduction states that can permit the conductivity facilitating compound to donate and accept ions. Examples of other conductivity facilitating compounds that can be employed for the passive layer 104 include one or more of the following: tungsten oxide ($WO_3$), molybdenum oxide ($MoO_3$), titanium selenide ($TiSe_2$), one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$), iron oxide ($Fe_3O_4$), and the like. The passive layer 104 may be grown using oxidation techniques, formed via gas phase reactions, or deposited between conducting electrodes of a polymer memory cell. It is to be appreciated that the invention is not so limited and other conducting and/or semi conducting materials can also be employed. The passive layer 104 has a suitable thickness that can vary based on the implementation and/or memory device being fabricated. The passive layer 104 can in some instances act as a catalyst when forming the active layer 102. In this connection, a backbone of a conjugated organic molecule can initially form adjacent the passive layer 104, and grow or assemble away and substantially perpendicular to the passive layer surface. As a result, the backbones of the conjugated organic molecule can be self aligned in a direction that traverses the conducting layer 106 (e.g., copper electrode) The passive layer 104 can be formed by a deposition process (e.g., thermal deposition, PVD, non-selective CVD, and the like) or by a complete sulfidation of pre-deposited thin Cu layer.

Figure 2:
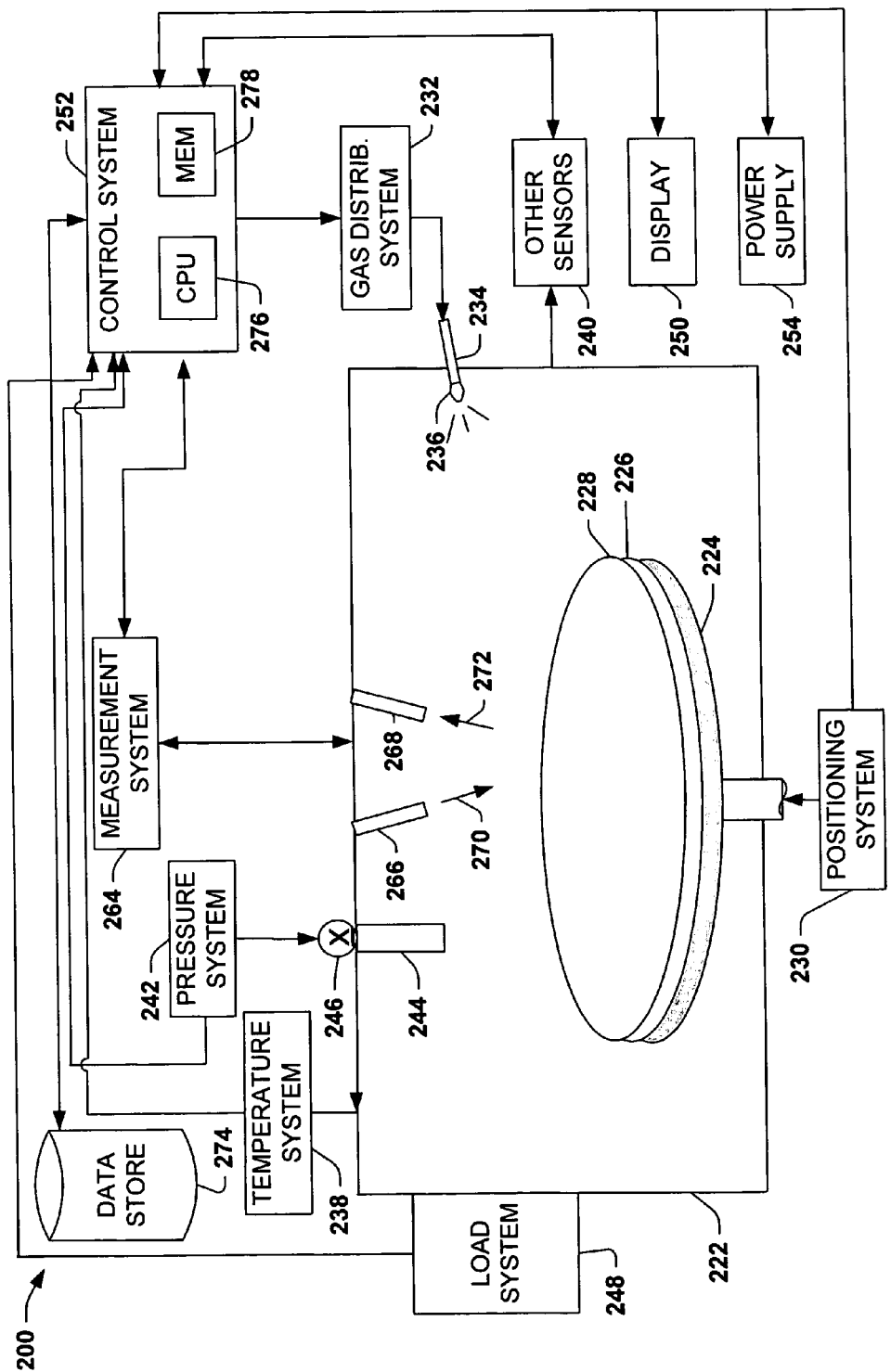
FIG. 2 depicts a system for bringing into contact various polymer cell layers with the post treatment compounds.

Turning now to FIG. 2, a control system 200 is illustrated for subjecting polymer memory layers to post treatment compound, (e.g., $(NH_4)_2S$, $(N)_2Se$, $H_2S$, $H_2Se$, $H_2Te$ and $H_2S$), for a treatment thereof. It is to be appreciated that treatment rates can vary in response to factors including, but not limited to, post treatment compound gaseous concentrations, temperatures and/or pressures.

The system 200 includes a chamber 222 defined by a housing having a plurality of walls. The treatment chamber 222 includes a support, such as may include a stage 224 (or chuck) operative to support a substrate with active layers and passive layers 226, 228 formed thereupon for which the post treatment compounds, for example $(NH_4)_2S$, $(NH_4)_2Se$, $H_2S$, $H_2Se$, $H_2Te$ $H_2S$, can be required as part of producing one or more organic electronic components, such as memory cells. A positioning system 230 is operatively connected to the support 224 for rotating the substrate with active and passive layers 226, 228 within the treatment chamber 222 in order to enhance uniformity. It is to be appreciated that any suitable positioning system can be employed in accordance with one or more aspects of the present invention.

A gas distribution system 232 is operatively coupled to the treatment chamber 222 for selectively providing gaseous post treatment compounds, and an inert gas into the treatment chamber 222 at various rates, volumes, concentrations, and the like, based upon, among other things, the amount (thickness) of various active and passive layers, the composition of such layers, the pressure within the chamber, the temperature within the chamber and/or the size of the chamber, for example. By way of illustration, the gas distribution system 232 can include one or more sources of gaseous hydrogen sulfides and inert gases. In the example illustrated, the gases are provided into the chamber through a conduit 234 that terminates in a nozzle 236. While, for purposes of brevity, a single nozzle 236 is shown in FIG. 2, it is to be appreciated that more than one nozzle or other gas delivery mechanisms can be employed to provide gas into the treatment chamber 222 at various mixtures and/or concentrations in accordance with one or more aspects of the present invention. For example, a shower head type gas delivery mechanism can be implemented to more evenly provide the post treatment compounds, as well as other chemicals into the chamber above the passive and active layers 226, 228. The gas distribution system 232 can inject a gaseous form of $(NH_4)_2S$, $(NH_4)_2Se$, $H_2Se$, $H_2Te$, $H_2S$, (e.g. %$2H_2S$ for a period of 5 to 15 minutes) into the chamber to function as a treatment medium for the active and passive layers. A temperature system 238 also is provided for selectively regulating the temperature within the chamber 222. For example, the system 238 can be a diffusion type system (e.g., a horizontal or vertical furnace) operable to diffusion heat into the treatment chamber 222. The temperature system 238 can implement its own temperature control process or such control may be implemented as part of other sensors 240 operatively associated with the treatment chamber 222.

By way of example, the post treat process can be carried out at a relatively low temperature of between about 300 to 500 K. A pressure system 242 is also included in the system to selectively regulate the pressure within the chamber. The pressure system 242 can include, for example, one or more vent conduits 244 having valves 246 that may be controllably opened and/or closed to varying degrees to assist with selectively adapting the pressure within the treatment chamber 222. The post treat process be performed at a relatively low pressure of between about 0.1 to 1.0 atm.

The system 200 can also include a load system 248 operatively connected to the treatment chamber 222 for loading and unloading substrates with passive and active layers into and out of the treatment chamber. The load system 248 typically is automated to load and unload such substrates or wafers into the chamber at a controlled rate. The system further may include a display 250 operatively coupled to a control system 252 for displaying a representation (e.g., graphical and/or textual) of one or more operating parameters (e.g., temperature within the chamber, pressure within the chamber, thickness of the active layer, chart of rate of density change for the active layer).

A power supply 254 is included to provide operating power to components of the system 200. Any suitable power supply (e.g., battery, line power) suitable for implementation with the present invention can be employed. The system can also include a measurement system 264 for in-situ monitoring of processing within the treatment chamber, such as, for example, a change of density for the various active and passive layers 226, 228 being treated with post treatment compound of $(NH_4)_2S$, $(NH_4)_2Se$, $H_2S$, $H_2Se$, $H_2Te$. The measurement system 264 can be a standalone component and/or can also be distributed between two or more cooperating devices and/or processes. Similarly, the measurement system 264 can reside in one physical or logical device (e.g., computer, process) and/or be distributed between two or more physical or logical devices. The measurement system 264 includes one or more non-destructive measurement components, such as one employing optical interference, scatterometry, IR spectroscopy, ellipsometry, scanning electron microscopy, synchrotron and/or x-ray diffraction techniques. The measurement system may include a beam source 266 and detector 268.

Figure 3:
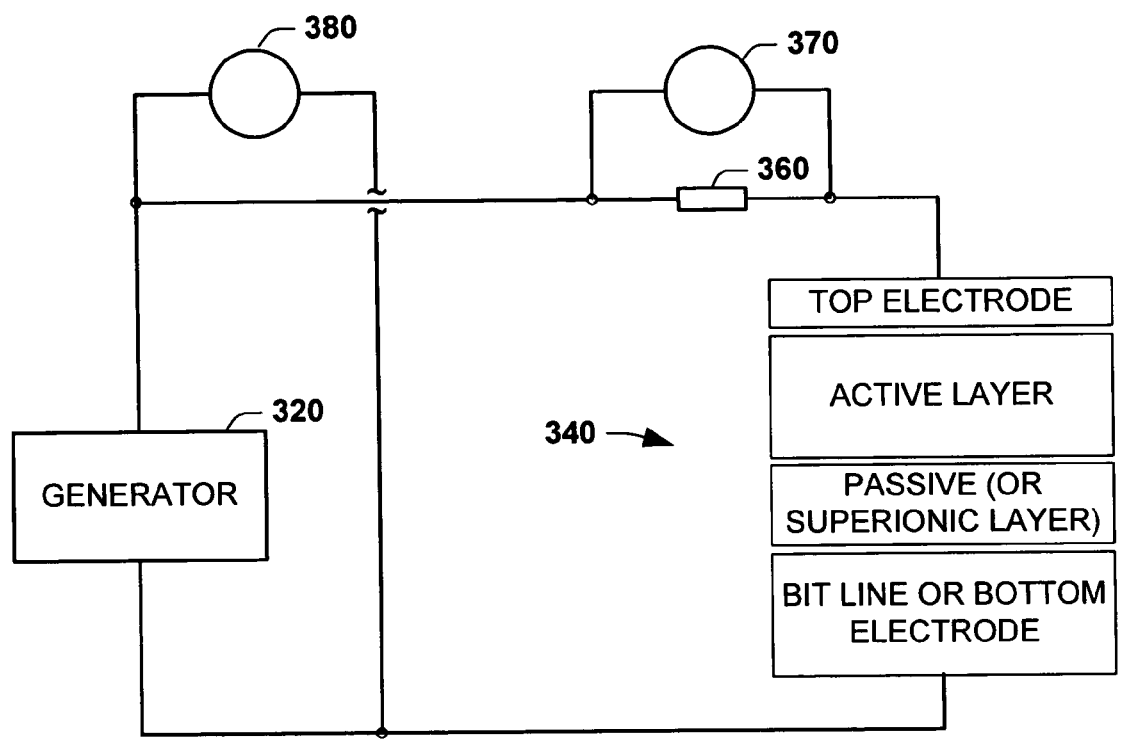
FIG. 3 illustrates a particular circuit for programming a polymer memory cell according to one aspect of the present invention.

Referring now to FIG. 3 a circuit that programs a memory cell 340 having passive and active layers that are treated with post treatment compound according to one aspect of the present invention is illustrated. Such treatment with $(NH_4)_2S$, $(H)_2Se$, $H_2S$, $H_2Se$, $H_2Te$ mitigates a need for subjecting the memory cell 340 to an initial electric field that can otherwise be typically required for an initialization stage (e.g. to provide a supply of positive ions within the polymer active layer) of the polymer cell. As such, variations in reference thresholds, which can affect a proper programming of the polymer memory cell, can be reduced.

The control system for programming the memory cell 340 includes a generator 320 that can provide a controllable electrical current level (e.g. a programmable current) during information writing and/or recording of the memory cell 340. The memory cell 340 includes two electrodes that sandwich various passive and active layers therebetween. It is to be appreciated that the present invention is not so limited and other layers such as various barrier layers can also be employed.

A ballast resistor 360 is operatively connected to the memory cell 340 thereby tending to limit the current independent of any resistance variations of the memory cell 340. Registering devices 370 and 380 can monitor circuit conditions during various programming stages of the memory cell 340. For example, the value of the current flowing through the memory cell can be obtained by measuring voltage on the ballast resistor 360, and such registering device can include voltmeters, oscillographs, recorders and other devices employed for monitoring circuit conditions at any moment.

Figure 4:
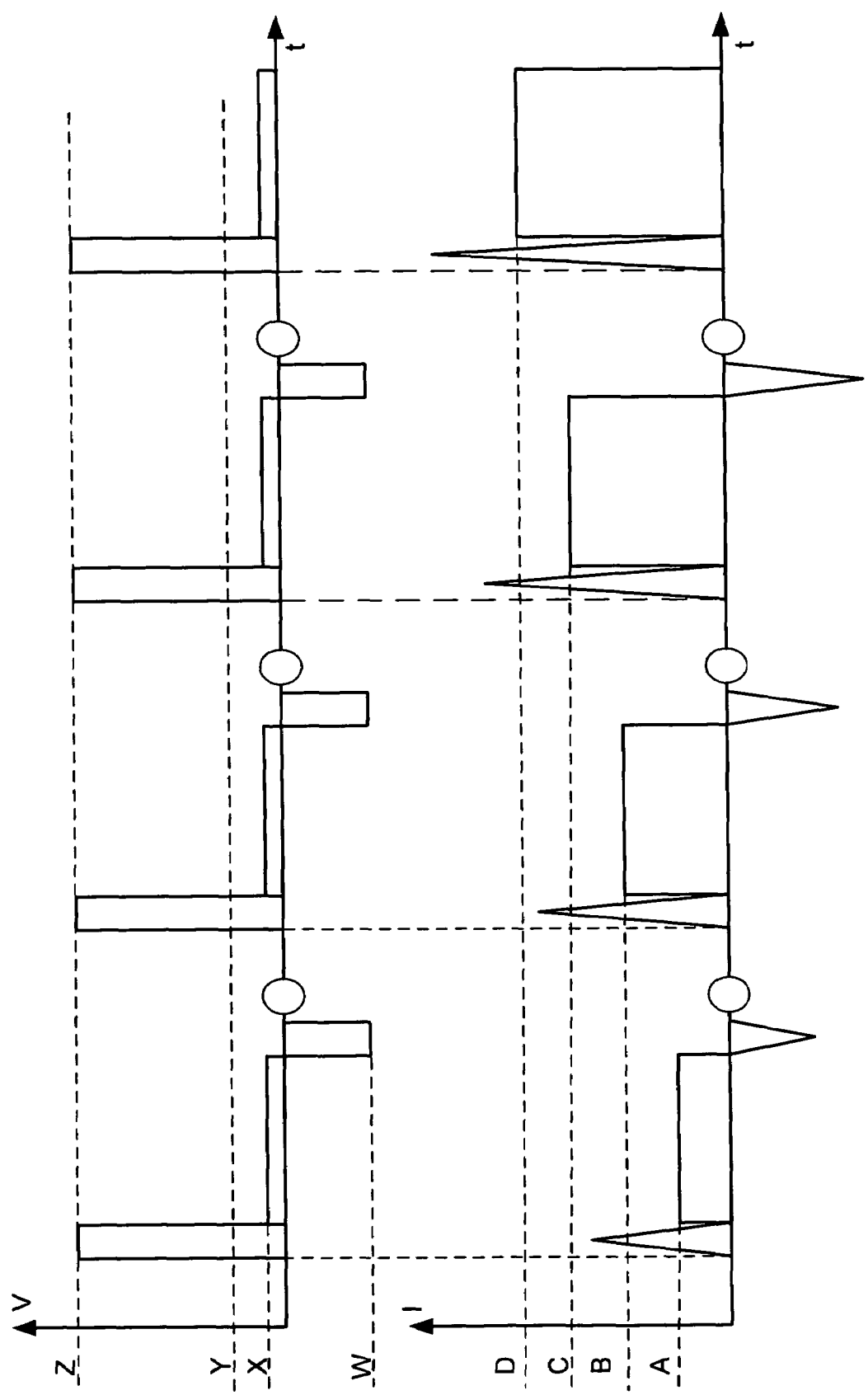
FIG. 4 illustrates graphs associated with voltage-time and current-time for various programming states of a memory cell according to one aspect of the present invention.

According to one particular methodology of the present invention, the generator 320 forms an initial voltage pulse that exceeds a threshold reference (e.g. voltage value) required for programming a memory cell. For example, FIG. 4 illustrates associated voltage-time and current-time graphs of such a methodology for writing a two bit memory cell operation. Voltage levels "Z" and "Y" depict an initial voltage pulse and a threshold voltage respectively. The values of the current flowing through the memory cell 340 can then be obtained by measuring voltage on the ballast resistor 360. As such, current flowing through the memory cell can be controlled such that the various electric current pulse states correspond to respective bits of information, written in to the memory cell. For example and as depicted in FIG. 4; electric current level "A" can designate a value "00", electric current level "B" can designate a value "01", electric current level "C" can designate a value "10", and electric current level "D" can designate the value "11", all which are programmable into the memory cell 340.

Next, and after the electric current pulse reaches the desired programmed state, the write programming is complete, and the programming voltage switched off. Similarly, to read bits of information from the memory cell 340, a reading voltage "X" that is lower than the threshold voltage value "Y" is generated via the generator 320. Based on the amount of current flowing through the ballast resistor 360 of FIG. 3, the resistance of the memory cell 340 can then be estimated, and an electric current flowing through it obtained. Such electric current can then correspond to a reference electric current, to verify a programmed state of the memory cell. Likewise, to erase information, the generator 320 creates a negative voltage pulse W, which can create a current, controlled to reach an erase threshold value flowing through the memory cell. It is to be appreciated that other properties besides voltage, current, or impedance can be employed to program a memory cell having a functioning zone. For example, the controlled value can be an intensity of light (optical programming when light sensor/emitter layers are employed), or amount of time that the memory cell is subject to an external stimulus and/or signal. Such can also depend upon the structure of a particular memory cell, and material employed in its fabrication, as for the particular memory structure illustrated by FIG. 3, it may be necessary to return the cell to its initial state and erase recorded information before a further write operation can be performed.

Figure 5:
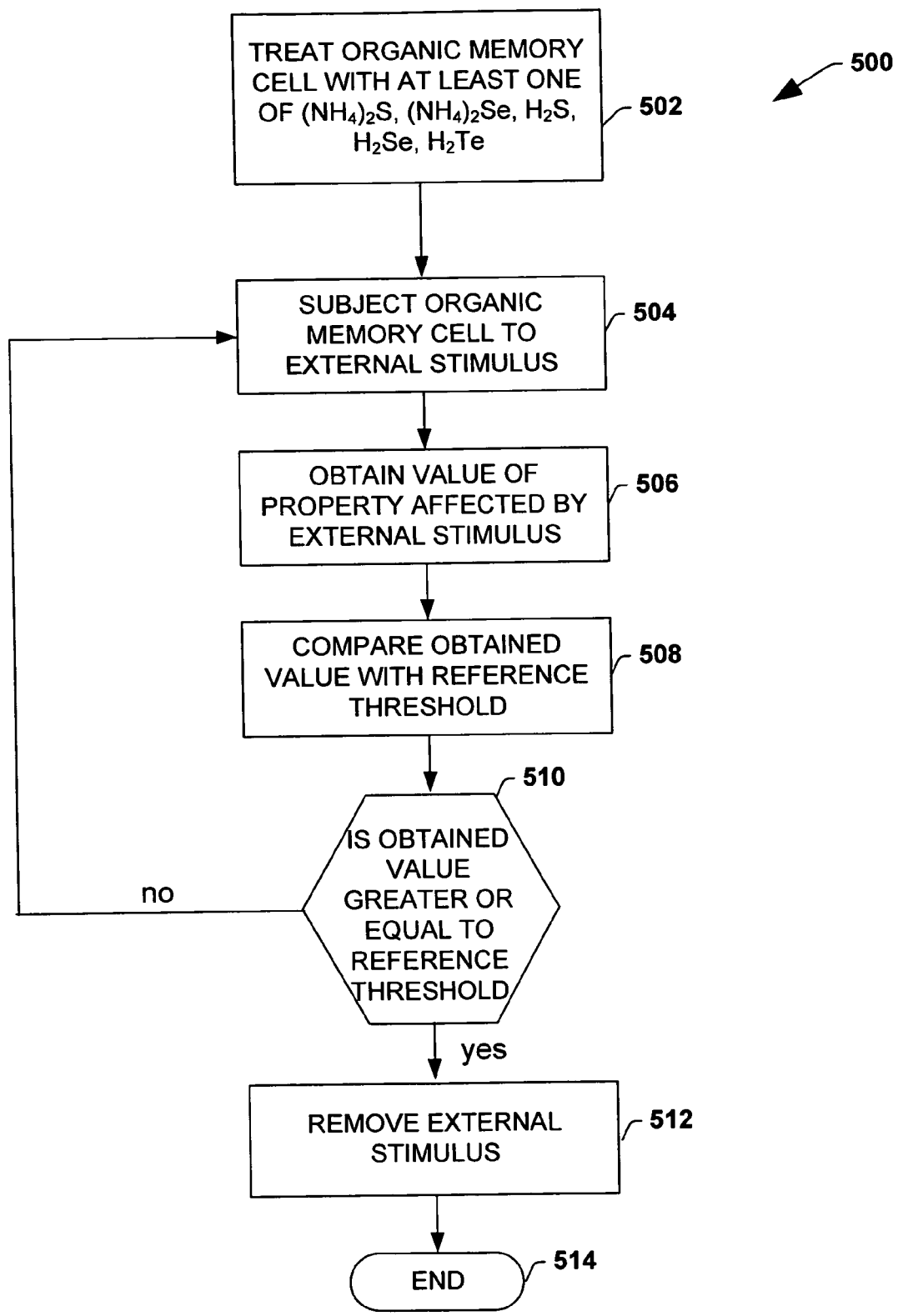
FIG. 5 illustrates an exemplary methodology for programming a memory cell in accordance with an aspect of the present invention.

Referring now to FIG. 5, a flow diagram illustrates a methodology 500 for programming a memory cell according to one or more aspects of the present invention. The methodology begins at 502 wherein the active and passive layers are subject to a post treatment with post treatment compounds such as $(NH_4)_2S$, $(NH_4)_2Se$, $H_2S$, $H_2Se$, $H_2Te$ as described in more detail supra. Such a treatment can also increase a density of the active layer (e.g. reduce thickness), and allow for a wider window for the process of forming the passive and active layers. For example, a wider doping range, layer thickness, reduction of void formation, and increased polymer memory cell yield can be obtained. Moreover, such treatment can also facilitate controlling a distribution of various thresholds (e.g., write and erase threshold), and set them to predetermined values (e.g., via the time of exposure to post treatment compound, concentration of the post treatment compound and the like). Accordingly, variability in threshold values of polymer memory cells that can result from initialization processes can be mitigated (or eliminated). Thus, thicker polymer layers can be employed without an initialization penalty.

Next and at 504, the memory cell to be programmed receives an external stimulus. Such an external stimulus can be supplied via a control component, and can change an electrical and/or optical property(ies) associated with the memory cell. The control component can further monitor/regulate the external stimulus, and thereby control the influenced property of the memory cell. At 506, the value of property thus affected can be obtained (e.g. calculated and/or measured). Subsequently at 508, the obtained value is compared (e.g. via a comparator of the control system) to a reference threshold determined for that particular property. Such reference threshold can set an upper limit associated with a particular programming state for the memory cell having a functional zone to be programmed. It is to be appreciated that other electrical/optical features that are dependent on the affected property can also be compared to respective predetermined values, and employed as reference criteria for verifying the program state.

Next, the process progresses to comparing step 510, if the value of the affected property exceeds or is equal to the reference threshold, then programming for such state is considered complete. The method then removes the external stimulus at 512, and ends at 514. Otherwise, the program returns to subjecting the memory cell to a new stimulus. It is to be appreciated that the reference threshold can set a lower limit associated with a particular programming state. Moreover, the threshold reference can also constitute a range, and the comparison step verifying whether the affected property of the memory cell falls within the range or not. While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. For example, the memory cell can be subject to a stimulus that facilitates reading bits of information, as opposed to writing or erasing. In addition, not all illustrated blocks, events or acts, may be required to implement a methodology in accordance with the present invention. Moreover, it will be appreciated that the exemplary method and other methods according to the invention may be implemented in association with programming the memory cell illustrated and described herein, as well as in association with other systems and apparatus not illustrated or described.

Figure 6:
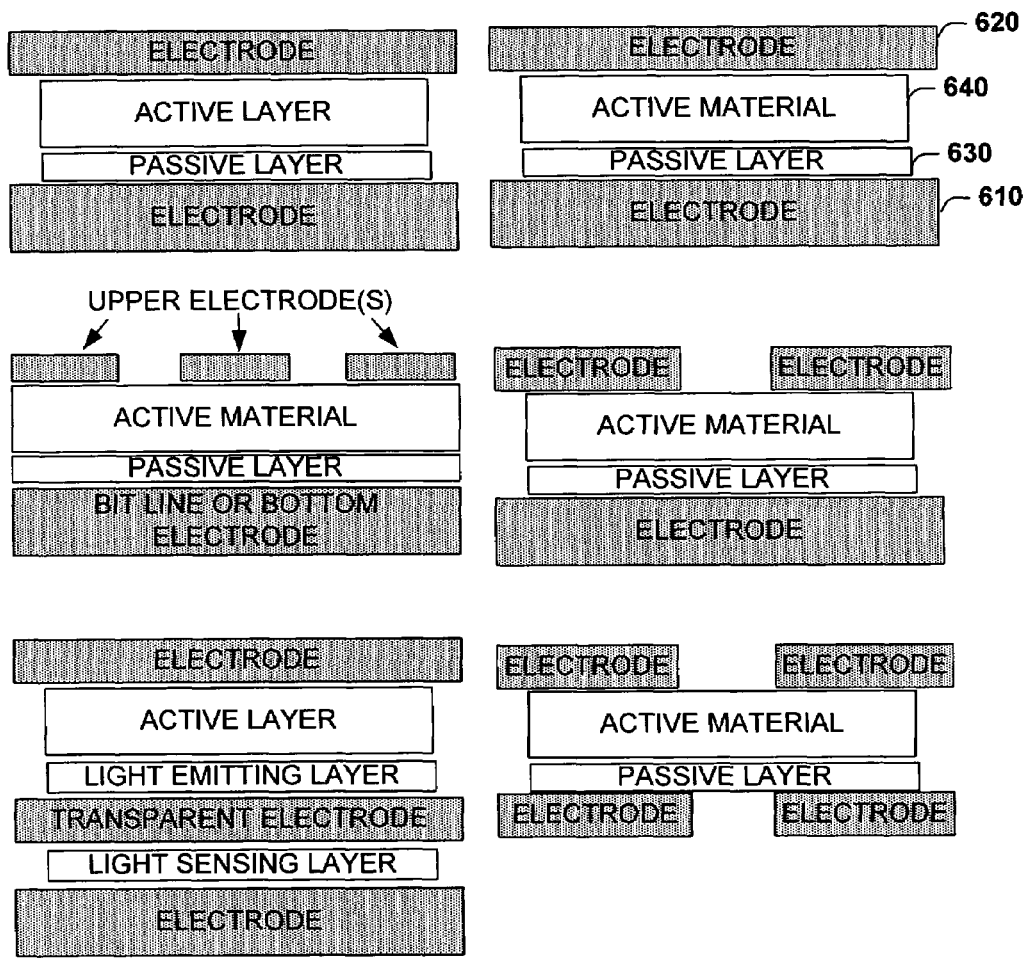
FIG. 6 illustrates various exemplary structures of memory devices treated in accordance with an aspect of the present invention.

Referring now to FIG. 6 structures of memory cells with various exemplary electrode arrangements and passive/active layers that can be subject to a post treatment process are illustrated. Typically for such memory cells, upper and lower electrodes sandwich various other active and passive layers that have been treated via for example $(NH_4)_2S$, $(NH_4)_2Se$, $H_2S$, $H_2Se$, $H_2Te$ and the like, as described supra. The electrodes (e.g. 610, 620) can be comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the electrodes can vary depending on the implementation and the memory device being constructed. However, some exemplary thickness ranges include about 100 nm or more and about 10 um or less for 610 and 620. The electrodes can be placed in an alternating fashion among various layers of for example semiconductor layers, polymer layers, and passive layers.

As explained supra, the passive layer 630 is operative to transport ions from electrode 610 to the interface between the active (e.g., organic) layer 640 and the passive layer 630. Additionally, the passive layer 630 facilitates ion injection into the active layer 640 and increases the concentration of the ions in the active layer resulting in a modification of the conductivity of the active layer 640. In addition, the passive layer 630 can in some instances act as a catalyst when forming the active layer 640. In this connection, backbone of the conjugated organic molecule may initially form adjacent the passive layer 630, and grow or assemble away and substantially perpendicular to the passive layer surface. As a result, the backbones of the conjugated organic molecule may be self aligned in a direction that traverses the two electrodes. The discussion infra describes and illustrates ionic concentration and models behavior of such organic memory devices.

In the following example, the active layer is conductive polymer with organic material, and $Cu_2S$ is used as passive layer material. It has relatively strong capability to gain electrons from a contacting polymer and yields the following equations:

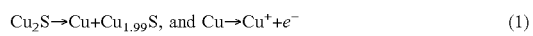

$$Cu_2S \rightarrow Cu + Cu_{1.99}S, \text{ and } Cu \rightarrow Cu^+ + e^- \qquad (1)$$

Figure 7:
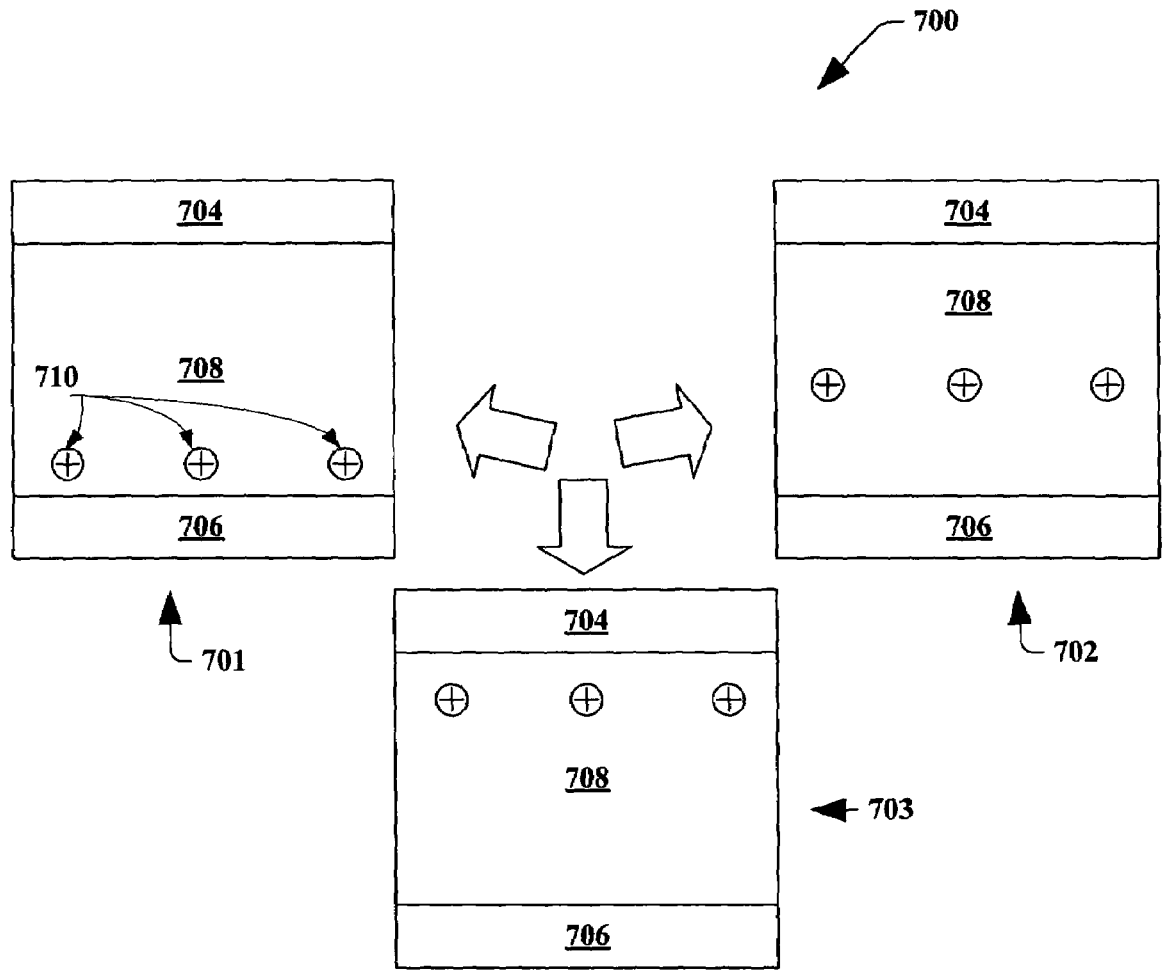
FIG. 7 is a schematic diagram depicting an organic memory device in various states in accordance with an aspect of the present invention.

The consequence is that an intrinsic field is produced due to the charges accumulated on the interface between CuS and polymer. This is shown in FIG. 7, which is a graph depicting the effect of an intrinsic electric field on an interface between $Cu(y)S$ (with y accepting a suitable value e.g., from 1 to 2) and a polymer is provided. The oxidized copper ($Cu^+$) is the charge carrier when external field is applied. The conductivity of polymer is determined by its concentration and its mobility.

$$\sigma = q \, p \, \mu \qquad (2)$$

Where q is the ionic charge, p is ion concentration and $\mu$ is the mobility.

FIG. 7 is a schematic diagram that illustrates an organic memory device 700 in various states (701, 702 and 703) in accordance with an aspect of the present invention. The device 700 is depicted in a first "off" state 701, an "on" state 702, and a second "off" state 703. It is appreciated that memory devices formed in accordance with the present invention can have other states than those depicted in FIG. 7. The organic memory device 700 comprises a top electrode 704, a bottom electrode 706 and a selectively conductive layer 708 comprising an organic layer (e.g., PPA) and at least one passive layer (e.g., $Cu_2S$). In the first off state 701, charges (e.g., positive ions) 710 collect in the selectively conductive layer 708 near the bottom electrode 706. In the on state 702, the charges 710 are uniformly distributed thereby indicating an on state. In the second off state 703, the charges collect in the selectively conductive layer 708 near the top electrode 704.

Figure 8:
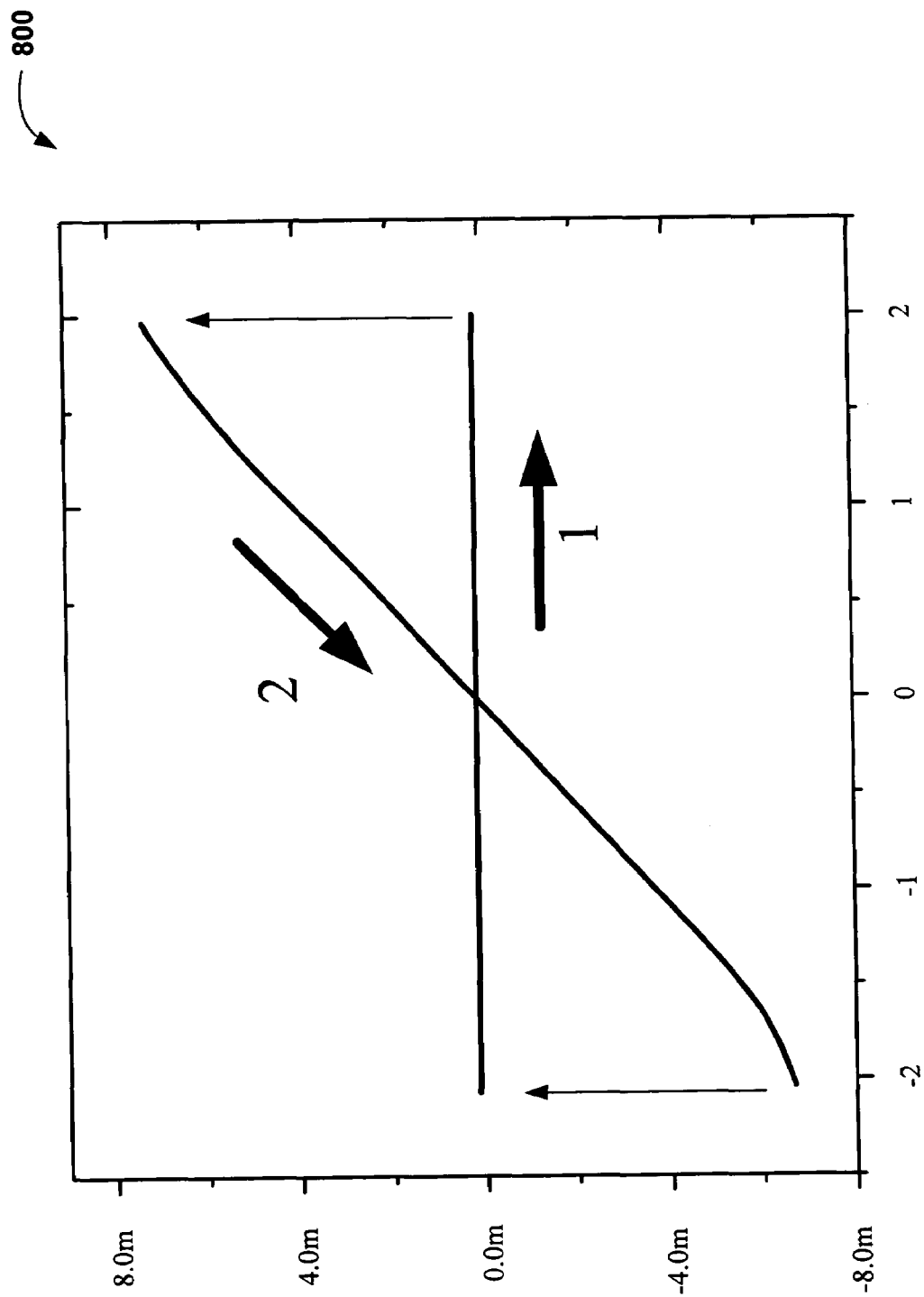
FIG. 8 is a graph illustrating I–V characteristics for an organic memory device in accordance with an aspect of the present invention.

FIG. 8 is a graph 800 that illustrates I–V characteristics for an organic memory device of the present invention. It can be seen that from state 1, which indicates "off", the device can be modified to be in state 2, which indicates "on", by applying a positive voltage of 2V. Additionally, it can be seen that whilst in state 1, the organic memory device has a high impedance and low conductance. Subsequently, the device 1500 can be modified to change from state 2 to state 1 by application of a negative voltage, therein causing a reverse current until the state 1 is obtained.

Turning now to FIGS. 9–11 a chuck 902 is shown in perspective supporting a wafer having a wafer 904 with polymer layers formed thereupon, wherein active and passive layers have been selectively formed. The wafer 904 can be logically partitioned into a grid pattern as shown in FIG. 10 to facilitate monitoring density and other changes as a result of the post treatment process on its polymer layers as it matriculates through a process in accordance with the present invention. Each grid block (XY) of the grid pattern corresponds to a particular portion of the wafer 904, and each grid block may have one or more memory cells having a common post treatment associated with that grid block. Portions can be individually monitored with one or more innocuous techniques such as, for example, optical interference, scatterometry, IR spectroscopy, ellipsometry, scanning electron microscopy, synchrotron and/or x-ray diffraction for properties including, but not limited to, density, thickness of the polymer layer, concentration of copper sulfide, etc. Such techniques can facilitate a statistical determination to what extent, if any, fabrication adjustments are necessary to mitigate problem areas and achieve desired results.

In FIG. 10, respective plots are illustrated for measurements taken at portions of polymer layer formed on the wafer 904 corresponding to grid mapped locations of the polymer layer ($X_1Y_1$ . . . $X_{12}$, $Y_{12}$). The plots can, for example, be signatures indicating whether density changes are occurring at an acceptable rate and/or has been thickness of the polymer layer has been reduced to a desired thickness in response to exposure to $(NH_4)_2S$, $(NH_4)_2Se$, $H_2S$, $H_2Se$, $H_2Te$ and the like. Given the values depicted in FIG. 10, it may be determined that an undesirable condition exists at one or more locations on the wafer 904. For instance, the measurement at coordinate $X_7Y_6$ yields a plot that is substantially higher than the respective measurements of the other portions XY. This can indicate, for example, that density changes of polymer layer are occurring too fast at this location. As such, fabrication components and/or operating parameters associated therewith can be adjusted accordingly on a statistical basis to mitigate this condition. For example, the degree that a vent valve is opened can be reduced so that the volume and/or rate of gaseous $(NH_4)_2S$, $(NH_4)_2Se$, $H_2S$, $H_2Se$, $H_2Te$ and the like to the process can be restricted. It is to be appreciated that although FIG. 10 illustrates the wafer 904 being mapped (partitioned) into 144 grid block portions, such wafer 904 can be mapped with any suitable number of portions to effect desired monitoring and control.

FIG. 11 illustrates a table of acceptable and unacceptable signature values. As can be seen, all the grid blocks, except grid block $X_7Y_6$, have measurement values corresponding to an acceptable value ($V_A$), while grid block $X_7Y_6$ has an undesired value ($V_U$). Thus, it has been determined that an undesirable condition exists at the portion of the polymer surface on the wafer 904 mapped by grid block $X_7Y_6$. Accordingly, fabrication process components and parameters may be adjusted as described supra to adapt the fabrication process accordingly to mitigate the occurrence or persistence of this condition.

Figure 12:
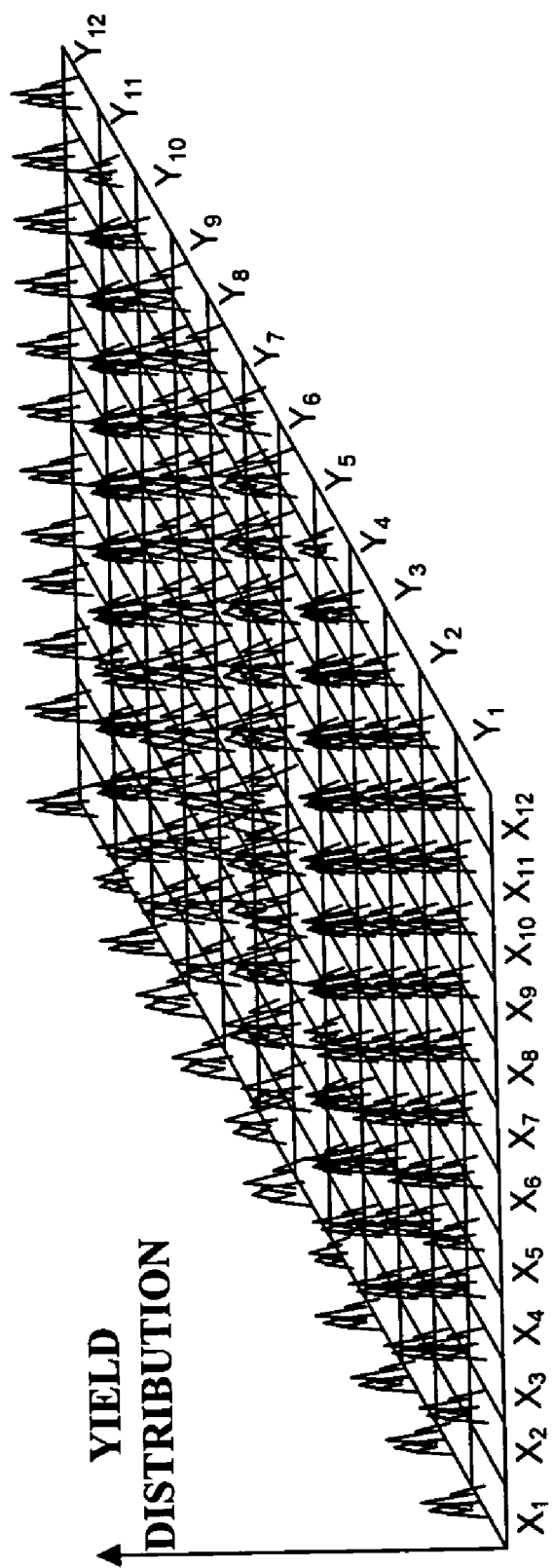
FIG. 12 illustrates a typically uniform manufacturing yield distribution after post treatment according to a methodology of the present invention.

FIG. 12 illustrates a typically uniform manufacturing yield distribution after post treatment according to the present invention. Such a yield distribution can for example represent a percentage of operational memory cells over a surface of a wafer. As illustrated, exposure of active and passive layers of memory cells to the post treatment compounds, which are applied to the wafer surface, can result in a more uniform and higher yielding cell distribution.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

What is claimed is:

1. A memory device comprising:
    an active layer with at least one of a metal particle and a metal containing molecular group (MCMG) that changes a state based on a migration of ions therefrom when subject to at least one of an external electric field and light radiation, the active layer treated with a compound that reacts with the at least one of the metal particles and the MCMG to form at least one of a metal ion and at least one of a charged chalcocide and a disparate metallic molecule in the active layer such that a need for an initialization process is at least one of mitigated and eliminated;
    at least one of a passive layer and a superionic layer that facilitates supply of ions to the active layer; and
    the active layer and at least one of the passive layer and the superionic layer are post treated with a compound comprising at least one of ammonium sulfate $(NH_4)_2S$, ammonium selenide $(NH_4)_2Se$, hydrogen sulfide $(H_2S)$, hydrogen selenide $(H_2Se)$, and hydrogen telluride $(H_2Te)$.

2. The memory device of claim 1, the active layer is a polymer layer.

3. The memory device of claim 1, the active layer is formed via a CVD process.

4. The memory device of claim 1, the active layer is comprised of at least one redox active metal, wherein the redox active metal includes at least one of: a metallocenes complex and a polypyridine metal complex.

5. The memory device of claim 1, the active layer comprises at least one of: polyaniline, polythiophene, polypyrrole, polysilane, polystyrene, polyfuran, polyindole, polyazulene, polyphenylene, polyfluorene, polypyridine, polybipyridine, polyphthalocyanine, polysexithiofene, poly (siliconoxohemiporphyrazine), poly(germaniumoxohemiporphyrazine), and poly(ethylenedioxythiophene) or copolymers thereof.

6. The memory device of claim 1, the active layer comprises at least one of: hydrocarbons; organic molecules with donor and acceptor properties, metallo-organic complexes; porphyrin, phtalocyanine, and hexadecafluorophtalocyanine.

7. The memory device of claim 1, the active layer is comprised of at least one organic molecule with a donor acceptor property, wherein the organic molecule includes at least one of: N-Ethylcarbazole, tetrathiotetracene, tetrathiofulvalene, tetracyanoquinodimethane, tetracyanoethylene, cloranol, and dinitrophenyl.

8. The memory device of claim 1, the active layer is comprised of at least one metallo-organic complex, wherein the metallo-organic complex includes at least one of bis-diphenylglyoxime, bisorthophenylenediimine, and tetraaza-tetramethylannulene.

9. The memory device of claim 1, the active layer comprises organic material selected from the group comprising of polyacetylene, polyphenylacetylene, polydiphenylacetylene, polyaniline, poly(p-phenylene vinylene), poly (phenylene), poly(fluorene), polythiophene, polyporphyrins, porphyrinic macrocycles, thiol derivatized polyporphyrins, polymetallocenes, polyferrocenes, polyphthalocyanines, polyvinylenes, and polystiroles.

10. The memory device of claim 1, the active layer comprises material selected from the group comprising of electric dipole elements, polymer ferroelectrics clusters, non-organic ferro-electrics, salts, alkalis, acids, and water molecules.

* * * * *